(12) United States Patent
Tang et al.

(10) Patent No.: US 10,993,351 B2
(45) Date of Patent: Apr. 27, 2021

(54) ONE MIXED HEAT SINK FINS FOR BETTER THERMAL DISSIPATION USED ON ELECTRICAL PRODUCTS

(71) Applicant: HARMAN INTERNATIONAL INDUSTRIES, INCORPORATED, Stamford, CT (US)

(72) Inventors: Wenbing Tang, Shanghai (CN); Guanting Huang, Jiangsu Province (CN); Haifeng Lu, Shanghai (CN); Liang Tan, Jiangsu Province (CN)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 16/386,159

(22) Filed: Apr. 16, 2019

(65) Prior Publication Data

US 2019/0327854 A1  Oct. 24, 2019

(30) Foreign Application Priority Data

Apr. 18, 2018  (CN) .......................... 201820550429.1

(51) Int. Cl.
*H05K 7/20*  (2006.01)
*H01L 23/467*  (2006.01)
(Continued)

(52) U.S. Cl.
CPC ......... *H05K 7/20145* (2013.01); *F28F 3/048* (2013.01); *F28F 13/06* (2013.01); *H01L 23/467* (2013.01); *H05K 7/20154* (2013.01)

(58) Field of Classification Search
CPC .................................................. H01L 23/467
See application file for complete search history.

(56) References Cited

U.S. PATENT DOCUMENTS 4,884,168 A * 11/1989 August .............. H05K 7/20254
361/702
5,150,278 A *  9/1992 Lynes .................. H02G 15/117
165/80.3
(Continued)

FOREIGN PATENT DOCUMENTS

DE    20 2010 011783 U1    11/2010
DE      102011118483 A1 *   5/2013  .......... H01L 23/473
(Continued)

OTHER PUBLICATIONS

Extended European Search Report for application No. 19168814.2 dated Sep. 27, 2019.

*Primary Examiner* — Robert J Hoffberg
(74) *Attorney, Agent, or Firm* — Artegis Law Group, LLP

(57) ABSTRACT

An electronic device and a heat-dissipation device for an electronic device are provided. The heat-dissipation device comprises an airflow channel; an airflow source located in the airflow channel; a plurality of elongated heat-dissipation fins arranged in the airflow channel; and a plurality of heat-dissipation flow-guiding devices arranged in the airflow channel and between the airflow source and the plurality of elongated heat-dissipation fins, wherein the plurality of heat-dissipation flow-guiding devices include a first heat-dissipation flow-guiding device in a central position of the airflow channel and a second heat-dissipation flow-guiding device on two sides of the airflow channel, and a longitudinal distance between the first heat-dissipation flow-guiding device and the airflow source is less than the distance between the second heat-dissipation flow-guiding device and the airflow source.

20 Claims, 4 Drawing Sheets

(51) Int. Cl.
*F28F 13/06* (2006.01)
*F28F 3/04* (2006.01)

(56) References Cited

U.S. PATENT DOCUMENTS

| | | | | |
|---|---|---|---|---|
| 6,173,758 B1* | 1/2001 | Ward | | H01L 23/3677 |
| | | | | 165/80.3 |
| 6,333,852 B1* | 12/2001 | Lin | | F28F 3/02 |
| | | | | 361/697 |
| 6,657,860 B2* | 12/2003 | Matsui | | G06F 1/203 |
| | | | | 165/121 |
| 6,989,134 B2* | 1/2006 | Tonkovich | | B01J 19/0093 |
| | | | | 422/602 |
| 7,027,300 B2* | 4/2006 | Lord | | H01L 23/467 |
| | | | | 165/80.3 |
| 7,117,928 B2* | 10/2006 | Chen | | H01L 23/3672 |
| | | | | 165/80.3 |
| 7,760,506 B1* | 7/2010 | Wang | | H05K 7/20727 |
| | | | | 361/679.48 |
| 8,291,967 B2* | 10/2012 | Yoshida | | F28F 3/02 |
| | | | | 165/104.21 |
| 8,310,830 B2* | 11/2012 | Zheng | | H05K 7/20918 |
| | | | | 165/80.3 |
| 8,363,408 B2* | 1/2013 | Zheng | | H01L 23/467 |
| | | | | 165/80.3 |
| 8,813,832 B2* | 8/2014 | Miki | | B61C 17/00 |
| | | | | 165/182 |
| 9,452,407 B2* | 9/2016 | Tonkovich | | B23K 31/02 |
| 9,657,997 B2* | 5/2017 | Fujita | | F28D 15/00 |
| 2003/0121645 A1* | 7/2003 | Wang | | F28D 15/0233 |
| | | | | 165/104.26 |
| 2004/0099712 A1 | 5/2004 | Tonkovich et al. | | |
| 2004/0244947 A1 | 12/2004 | Chen | | |
| 2005/0057899 A1 | 3/2005 | Lord | | |
| 2006/0056153 A1 | 3/2006 | Lopatinsky et al. | | |
| 2008/0066888 A1* | 3/2008 | Tong | | H01L 23/3677 |
| | | | | 165/80.3 |
| 2008/0144279 A1* | 6/2008 | Yamamoto | | H05K 7/20918 |
| | | | | 361/694 |
| 2009/0145581 A1* | 6/2009 | Hoffman | | F28F 1/40 |
| | | | | 165/80.3 |
| 2010/0193162 A1* | 8/2010 | Liang | | H01L 23/3672 |
| | | | | 165/104.34 |
| 2013/0112388 A1* | 5/2013 | Kwak | | H01L 23/473 |
| | | | | 165/185 |
| 2014/0342652 A1 | 11/2014 | Dong et al. | | |
| 2018/0270986 A1* | 9/2018 | Zaindl | | H05K 7/20863 |

FOREIGN PATENT DOCUMENTS

| | | | | |
|---|---|---|---|---|
| EP | 3 349 555 A1 | 7/2018 | | |
| EP | 3 376 839 A1 | 9/2018 | | |
| KR | 2003016491 A | * 3/2003 | | H01L 23/3672 |

* cited by examiner

ONE MIXED HEAT SINK FINS FOR BETTER THERMAL DISSIPATION USED ON ELECTRICAL PRODUCTS

CROSS-REFERENCE TO RELATED APPLICATIONS

This application claims the priority of co-pending Chinese patent application titled, "ONE MIXED HEATSINK FINS FOR BETTER THERMAL DISSIPATION USED ON ELECTRICAL PRODUCTS" filed on Apr. 18, 2018 and having Serial No. 201820550429.1. The subject matter of this related application is hereby incorporated herein by reference.

TECHNICAL FIELD

This utility model relates to a heat-dissipation device for an electronic device. This utility model further relates to an electronic device including the heat-dissipation device.

BACKGROUND ART

With the integration and miniaturization of electronic circuits in electronic devices, the heat release of the electronic circuits per unit volume is increasing, so the heat dissipation problem of the electronic devices is becoming increasingly significant. In order to improve the heat dissipation effect, a fan and a set of heat-dissipation fins are arranged in an airflow channel in an existing heat-dissipation device. An airflow from the fan flows along the airflow channel and flows over the surfaces of the heat-dissipation fins to remove heat from the surfaces of the heat-dissipation fins, thus achieving heat dissipation. However, the inventor of this utility model finds that in such a heat-dissipation device, the airflow flowing through the set of heat-dissipation fins is usually uneven, and the velocity of the airflow flowing through the heat-dissipation fins in a central position of the airflow channel is much greater than the velocity of the airflow flowing through the heat-dissipation fins on two sides, which greatly affects the heat dissipation efficiency of the heat-dissipation device.

Therefore, there is a need for a heat-dissipation device that can allow the airflow to evenly flow through the heat-dissipation fins, thus improving the heat dissipation efficiency. At the same time, the heat-dissipation device is also required to have a simple structure and basically does not increase airflow resistance.

SUMMARY OF THIS UTILITY MODEL

A heat-dissipation device for an electronic device is provided in this utility model, comprising:
an airflow channel;
an airflow source located in the airflow channel;
a plurality of elongated heat-dissipation fins arranged in the airflow channel; and
a plurality of heat-dissipation flow-guiding devices arranged in the airflow channel and between the airflow source and the plurality of elongated heat-dissipation fins, wherein the plurality of heat-dissipation flow-guiding devices include a first heat-dissipation flow-guiding device in a central position of the airflow channel and a second heat-dissipation flow-guiding device on two sides of the airflow channel, and a longitudinal distance between the first heat-dissipation flow-guiding device and the airflow source is less than the distance between the second heat-dissipation flow-guiding device and the airflow source.

Optionally, the plurality of elongated heat-dissipation fins extend along a longitudinal direction of the airflow channel respectively and are spaced apart from each other in a transverse direction perpendicular to the longitudinal direction of the airflow channel, and the plurality of heat-dissipation flow-guiding devices are spaced apart from each other in the transverse direction perpendicular to the longitudinal direction of the airflow channel.

Optionally, the plurality of heat-dissipation flow-guiding devices further include a third heat-dissipation flow-guiding device between the first heat-dissipation flow-guiding device and the second heat-dissipation flow-guiding device, and a longitudinal distance between the third heat-dissipation flow-guiding device and the airflow source is greater than the distance between the first heat-dissipation flow-guiding device and the airflow source and less than the distance between the second heat-dissipation flow-guiding device and the airflow source.

Optionally, the first heat-dissipation flow-guiding device includes one or more first heat-dissipation flow-guiding column rows, the second heat-dissipation flow-guiding device includes one or more second heat-dissipation flow-guiding column rows, and the third heat-dissipation flow-guiding device includes one or more third heat-dissipation flow-guiding column rows.

Optionally, the number of heat-dissipation flow-guiding columns of each third heat-dissipation flow-guiding column row is less than the number of heat-dissipation flow-guiding columns of each first heat-dissipation flow-guiding column row and greater than the number of heat-dissipation flow-guiding columns of each second heat-dissipation flow-guiding column row.

Optionally, in a direction from the center of the airflow channel to the two sides, the number of the heat-dissipation flow-guiding columns of each heat-dissipation flow-guiding column row in the first heat-dissipation flow-guiding column rows, the second heat-dissipation flow-guiding column rows and the third heat-dissipation flow-guiding column rows is descending.

Optionally, the cross-section shape of each heat-dissipation flow-guiding column is selected from a rectangle, a circle, an oval, a diamond, or a triangle.

Optionally, the plurality of elongated heat-dissipation fins are parallel to each other.

Optionally, the airflow channel is defined by a bottom wall, two side walls and a top wall, and in the transverse direction perpendicular to the longitudinal direction of the airflow channel, each heat-dissipation flow-guiding column row is located between corresponding two adjacent elongated heat-dissipation fins or between the corresponding outermost elongated heat-dissipation fin and the corresponding side wall.

Optionally, the airflow channel is defined by a bottom wall, two side walls and a top wall, and in the transverse direction perpendicular to the longitudinal direction of the airflow channel, each heat-dissipation flow-guiding column row is centrally located between corresponding two adjacent elongated heat-dissipation fins or centrally located between the outermost elongated heat-dissipation fin and the corresponding side wall.

Optionally, at least some heat-dissipation flow-guiding columns in each heat-dissipation flow-guiding column row of the first heat-dissipation flow-guiding device, the second heat-dissipation flow-guiding device and the third heat-dissipation flow-guiding device are aligned to corresponding heat-dissipation flow-guiding columns in another heat-dissipation flow-guiding column row.

Optionally, the heat-dissipation flow-guiding device is an integral extension part of the plurality of elongated heat-dissipation fins.

Optionally, the plurality of elongated heat-dissipation fins are parallel to each other, and longitudinal distances between the heat-dissipation flow-guiding devices and the airflow source are ascending in a direction from the center of the airflow channel to the two sides.

Optionally, the plurality of heat-dissipation flow-guiding devices are made of aluminum or steel.

Optionally, the airflow source is a fan.

Optionally, the airflow channel is defined by a bottom wall, two side walls and a top wall, and the side walls include an inclined sidewall portion extending outward in an airflow direction of the airflow channel and located downstream of the airflow source.

In another aspect of this utility model, an electronic device is provided, comprising the heat-dissipation device for an electronic device as described in the foregoing and an electronic component in thermal communication with the heat-dissipation device.

DETAILED DESCRIPTION

Figure 1:
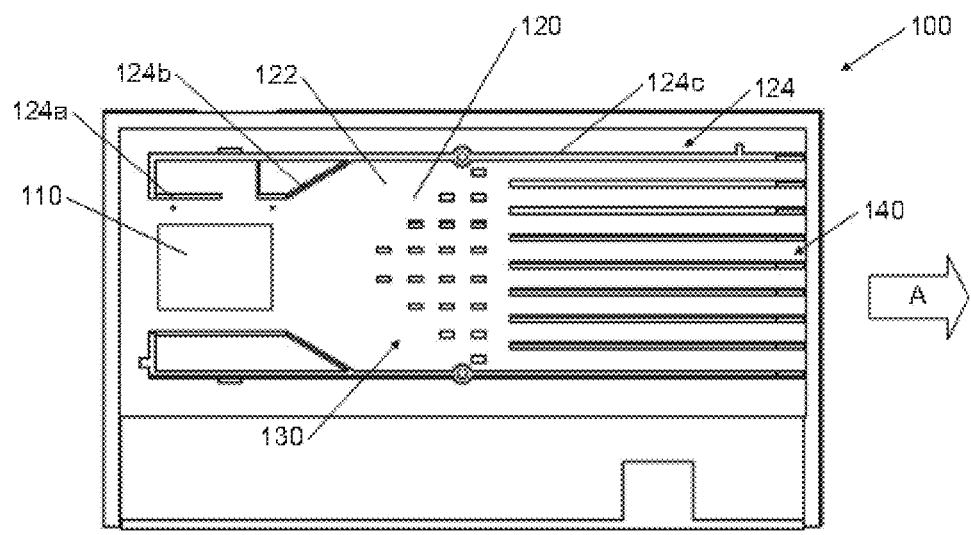
FIG. 1 is a top view of the heat-dissipation device according to a preferred embodiment of this utility model.

Embodiments of this utility model are described in detail below, and examples of the embodiments are shown in the accompanying drawings. Identical or similar reference numerals throughout this text represent identical or similar elements or elements having identical or similar functions. The embodiments described below with reference to the accompanying drawings are exemplary, are only used to explain this utility model, and cannot be construed as limitations to this utility model.

Unless otherwise defined, technical or scientific terms used here shall be of general meanings understood by those of ordinary skill in the field to which this utility model belongs. In the description of this utility model, it is appreciated that orientation or position relations indicated by the terms "center," "longitudinal," "transverse," "upper," "lower," "front," "rear," "left," "right," "vertical," "horizontal," "top," "bottom," "inside," "outside" and so on are orientation or position relations shown based on the accompanying drawings, which are only intended to facilitate the description of this utility model and simplify the description, rather than indicate or imply that the device or element referred to must have a specific orientation or be constructed and operated in the specific orientation, and thus cannot be construed as limitations to this utility model. In addition, the terms "first" and "second" are used only for description and cannot be construed as indicating or implying relative importance.

Figure 2:
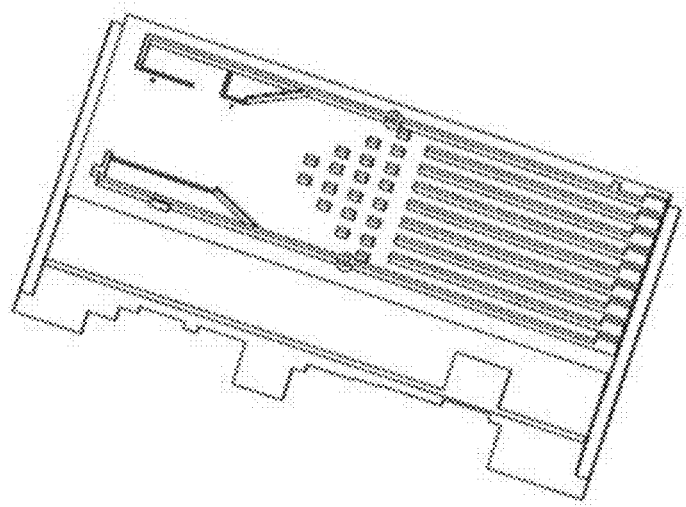
FIG. 2 is a three-dimensional view of the heat-dissipation device shown in FIG. 1.
Figure 3:
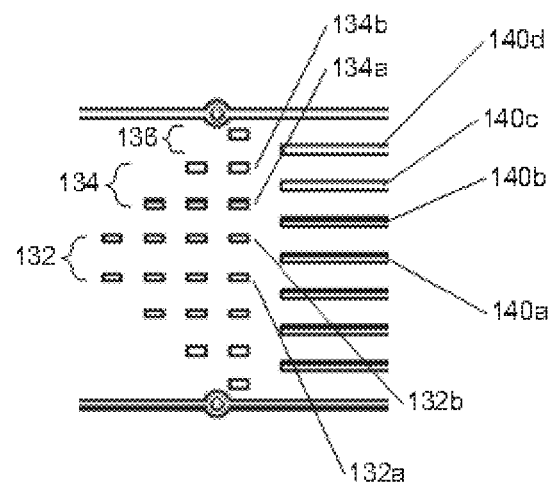
FIG. 3 is an enlarged view of a part of the heat-dissipation device shown in FIG. 1.

FIG. 1 to FIG. 3 are schematic views showing a heat-dissipation device 100 according to an embodiment of this utility model. FIG. 1 is a top view, FIG. 2 is a three-dimensional view, and FIG. 3 is an enlarged view of a part of FIG. 1. As shown in FIG. 1, the heat-dissipation device 100 includes an airflow channel 120. The airflow channel 120 is defined by a bottom wall 122, two side walls 124, and a top wall (not shown). A fan 110, a plurality of heat-dissipation flow-guiding devices 130, and a plurality of heat-dissipation fins 140 are arranged in the airflow channel 120. An airflow from the fan 110 flows approximately along a longitudinal direction A of the airflow channel 120, and flows through the plurality of heat-dissipation flow-guiding devices 130 and the plurality of heat-dissipation fins 140 in sequence, and takes away the heat of the heat-dissipation flow-guiding devices 130 and the heat-dissipation fins 140, thus achieving heat dissipation.

As shown in FIG. 3, the plurality of heat-dissipation fins 140 include seven heat-dissipation fins arranged in parallel. The seven heat-dissipation fins extend along the longitudinal direction of the airflow channel 120 are aligned to each other and are evenly spaced apart from each other and apart from corresponding side walls. The plurality of heat-dissipation flow-guiding devices 130 include eight heat-dissipation flow-guiding column rows. The eight heat-dissipation flow-guiding column rows are symmetrically distributed horizontally. In order to save space, the four upper heat-dissipation flow-guiding column rows are mainly described here. The plurality of heat-dissipation flow-guiding devices 130 include two heat-dissipation flow-guiding column rows 132a and 132b (or collectively referred to as a heat-dissipation flow-guiding column row 132 or a first heat-dissipation flow-guiding device 132) in central positions of the airflow channel 120 (farthest from the side wall 124), a heat-dissipation flow-guiding column row 136 (or referred to as a second heat-dissipation flow-guiding device 136) in a position on two sides of the airflow channel 120 (adjacent to the side wall 124), and two heat-dissipation flow-guiding column rows 134 (or collectively referred to as heat-dissipation flow-guiding columns 134 or a third heat-dissipation flow-guiding device 134) between the heat-dissipation flow-guiding column rows 132a, 132b and the heat-dissipation flow-guiding column row 136. As shown in the figure, in the transverse direction perpendicular to the longitudinal direction of the airflow channel, each heat-dissipation flow-guiding column row is located between corresponding two adjacent elongated heat-dissipation fins or between the corresponding outermost elongated heat-dissipation fin and the corresponding side wall. For example, in the transverse direction, the heat-dissipation flow-guiding column row 132b is located between heat-dissipation fins 140a and 140b, the heat-dissipation flow-guiding column row 134a is located between heat-dissipation fins 140b and 140c, the heat-dissipation flow-guiding column row 134b is located between heat-dissipation fins 140c and 140d, and the heat-dissipation flow-guiding column row 136 is located between the heat-dissipation fin 140d and the corresponding side wall 124. In a preferred embodiment shown in FIG. 3, in the transverse direction, the heat-dissipation flow-guiding column row 132b is centrally located between heat-dissipation fins 140a and 140b, the heat-dissipation flow-guiding column row 134a is centrally located between heat-dissipation fins 140b and 140c, the heat-dissipation flow-guiding column row 134b is centrally located between heat-dissipation fins 140c and 140d, and the heat-dissipation flow-guiding column row 136 is centrally located between the heat-dissipation fin 140d and the corresponding side wall 124.

As shown in FIG. 1 and FIG. 3, in a direction from the central position of the airflow channel 120 to the two sides, the number of the heat-dissipation flow-guiding columns of each heat-dissipation flow-guiding column row is descending. That is, the heat-dissipation flow-guiding column row 132b includes four heat-dissipation flow-guiding columns, the heat-dissipation flow-guiding column row 134a includes three heat-dissipation flow-guiding columns, the heat-dissipation flow-guiding column row 134b includes two heat-dissipation flow-guiding columns, and the heat-dissipation flow-guiding column row 136 includes one heat-dissipation flow-guiding column. The corresponding heat-dissipation flow-guiding columns in each heat-dissipation flow-guiding column row are aligned to each other in the transverse direction. That is, the first heat-dissipation flow-guiding columns (heat-dissipation flow-guiding columns that are closest to the heat-dissipation fins in the heat-dissipation flow-guiding column rows) in each heat-dissipation flow-guiding column row are aligned to each other (i.e., in identical longitudinal positions), the second heat-dissipation flow-guiding columns (heat-dissipation flow-guiding columns that are second closest to the heat-dissipation fins in the heat-dissipation flow-guiding column rows, if any) in each heat-dissipation flow-guiding column row are aligned to each other, and so on. Therefore, longitudinal distances between the two heat-dissipation flow-guiding column rows 132a and 132b (or collectively referred to as heat-dissipation flow-guiding column 132 or first heat-dissipation flow-guiding device 132) in the central positions of the airflow channel and the fan 110 are the shortest. In a direction from the center of the airflow channel to the two sides, the longitudinal distances between the heat-dissipation flow-guiding column rows and the fan are ascending.

The inventor of this utility model has found that when the heat-dissipation flow-guiding device 130 of this utility model is absent, the airflow from the fan mainly passes through the central position of the airflow channel, that is, the wind speed on two sides of the heat-dissipation fin 140a is maximum, while the wind speed between the heat-dissipation fin 140d and the side wall is very small. As described above, the longitudinal distances between the two heat-dissipation flow-guiding column rows 132a and 132b and the fan are the shortest. Therefore, the airflow from the fan 110 first encounters the heat-dissipation flow-guiding column rows 132a and 132b. The heat-dissipation flow-guiding column row 132b is located between the heat-dissipation fins 140a and 140b, preferably centrally located between the heat-dissipation fins 140a and 140b, and the heat-dissipation flow-guiding column row 134a is located between the heat-dissipation fins 140b and 140c, preferably centrally located between the heat-dissipation fins 140b and 140c. A flow path from the fan 110 to the heat-dissipation fins 140a and 140b is affected by the heat-dissipation flow-guiding column row 132b, and a part of the airflow on the flow path is deflected by the heat-dissipation flow-guiding column row 132b to a side of the airflow channel. After that, an airflow on a flow path from the fan 110 to the heat-dissipation fins 140b and 140c and the part of the airflow deflected by the heat-dissipation flow-guiding column row 132b encounter the heat-dissipation flow-guiding column row 134a, and a part of them is deflected by the heat-dissipation flow-guiding column row 134a to a side of the airflow channel. As such, the airflow originally concentrated in the central position of the airflow channel 120 is dispersed by the heat-dissipation flow-guiding column rows and passes more evenly through the heat-dissipation fins, thus improving the heat dissipation efficiency.

In general, the longitudinal distances between the heat-dissipation flow-guiding column rows and the fan are ascending in the direction from the center of the airflow channel to the two sides. Therefore, as shown in FIG. 3, all heat-dissipation flow-guiding columns assume an isosceles triangle as a whole, and the vertex of the isosceles triangle faces the fan 110. As shown in FIG. 1, two inclined sides of the isosceles triangle, together with the inclined side wall 124b, are conducive to guiding the airflow from the central position of the airflow channel to the two sides, so that the airflow passes more evenly through the heat-dissipation fins, thus improving the heat dissipation efficiency.

Figure 6:
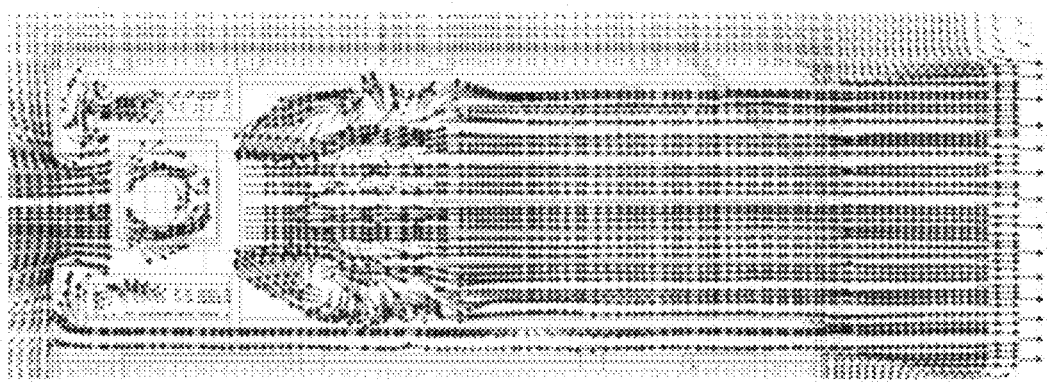
FIG. 6 is a simulation result of numerical simulation of the embodiment in FIG. 1 to FIG. 3 using fluid dynamics software.

In order to verify the technical effect of this utility model, the inventor of this utility model uses fluid mechanics software to carry out numerical simulation on the embodiment shown in FIG. 1 to FIG. 3 and a comparative embodiment. The comparative embodiment is basically similar to the embodiment shown in FIG. 1 to FIG. 3, with the only difference that the comparative embodiment does not include the inclined side wall 124b (that is, the side wall 124a is at a right angle with the side wall 124c) and the heat-dissipation flow-guiding device 30 (correspondingly, compared with the embodiment in FIG. 1 to FIG. 3, the heat-dissipation fins of the comparative embodiment extend longer towards the direction of the fan 110 to at least partially replace blank positions left by the heat-dissipation flow-guiding device 130). FIG. 6 is a result of simulation carried out in the embodiment shown in FIG. 1 to FIG. 3, and FIG. 5 is a result of simulation carried out in the comparative embodiment. Please refer to Table 1 for the result of simulation. Position 1 is between the heat-dissipation fins 140a and 140b, Position 2 is between the heat-dissipation fins 140b and 140c, Position 3 is between the heat-dissipation fins 140c and 140d, and Position 4 is between the heat-dissipation fin 140d and the side wall.

TABLE 1

| | Velocity in Position 1 | Velocity in Position 2 | Velocity in Position 3 | Velocity in Position 4 | Average velocity |
|---|---|---|---|---|---|
| Comparative embodiment | 2.18 m/s | 1.72 m/s | 0.039 m/s | 0.177 m/s | 1.03 m/s |
| Embodiment 1 | 2.13 m/s | 2.13 m/s | 1.15 m/s | 0.764 m/s | 1.54 m/s |

As shown in Table 1, in Embodiment 1, the airflow velocities in Position 1 and Position 2 are identical, both of which are 2.13 m/s, while in the comparative embodiment, the airflow velocity in Position 1 is maximum, and the airflow velocity in Position 2 is evidently lower than the airflow velocity in Position 1. In addition, in Embodiment 1, the airflow velocity in Position 4 is about ⅓ of that in Position 1, while in the comparative embodiment, the airflow velocity in Position 4 is less than 1/10 of that in Position 1. Therefore, compared with the comparative embodiment, the airflow in the entire airflow channel 120 is more even in Embodiment 1.

In addition, the average velocity of Positions 1-4 in Embodiment 1 is 1.54 m/s, while the average velocity of Positions 1-4 in the comparative embodiment is 1.03 m/s. Therefore, the average airflow velocity of the entire airflow channel in Embodiment 1 is greater, and a better heat dissipation effect is also achieved.

FIG. 1 to FIG. 3 show a preferred embodiment of this utility model. However, this utility model is not limited thereto. For example, a fan is used in the embodiment shown in FIG. 1 to FIG. 3, but this utility model is not limited thereto. In an optional embodiment, any suitable airflow source can be used in this utility model.

Figure 4:
FIG. 4 is optional shapes of a heat-dissipation flow-guiding column according to this utility model.
Figure 5:
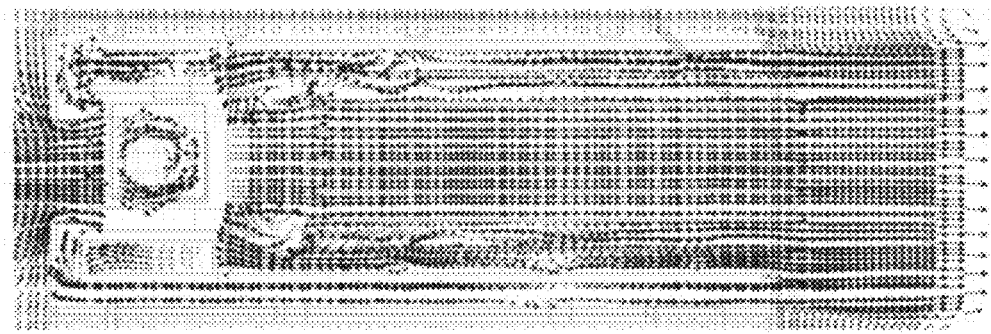
FIG. 5 is a simulation result of numerical simulation of a comparative embodiment using fluid dynamics software.

In the embodiment shown in FIG. 1 to FIG. 3, the cross section of the heat-dissipation flow-guiding column is rectangular, but this utility model is not limited thereto. The cross section of the heat-dissipation flow-guiding column of this utility model may be in any suitable shape, for example, a circle, a square, an oval, a diamond and a triangle as shown in FIG. 4.

In the embodiment shown in FIG. 1 to FIG. 3, seven heat-dissipation fins and eight heat-dissipation flow-guiding column rows are included, but this utility model is not limited thereto. In an optional embodiment, this utility model may include any suitable number of heat-dissipation fins and heat-dissipation flow-guiding column rows.

In the embodiment shown in FIG. 1 to FIG. 3, the shape of each heat-dissipation flow-guiding column is basically the same, and the spacing between the heat-dissipation flow-guiding column rows and the spacing between the heat-dissipation flow-guiding columns in each heat-dissipation flow-guiding column row are basically the same, but this utility model is not limited thereto. In an optional embodiment, the shapes of the heat-dissipation flow-guiding columns may be different, the spacing between the heat-dissipation flow-guiding column rows may be different, and/or the spacing between the heat-dissipation flow-guiding columns in each heat-dissipation flow-guiding column row may be different.

In the embodiment shown in FIG. 1 to FIG. 3, the heat-dissipation flow-guiding columns of each heat-dissipation flow-guiding column row are basically aligned along a longitudinal direction of the airflow channel, but this utility model is not limited thereto. In an optional embodiment, heat-dissipation flow-guiding columns of at least part of the heat-dissipation flow-guiding column rows are not aligned along the longitudinal direction of the airflow channel.

In the embodiment shown in FIG. 1 to FIG. 3, the heat-dissipation flow-guiding column rows each include a plurality of heat-dissipation flow-guiding columns, but this utility model is not limited thereto. In an optional embodiment, at least part of adjacent heat-dissipation flow-guiding columns in at least one heat-dissipation flow-guiding column row may be connected together to form a whole.

Figure 7:
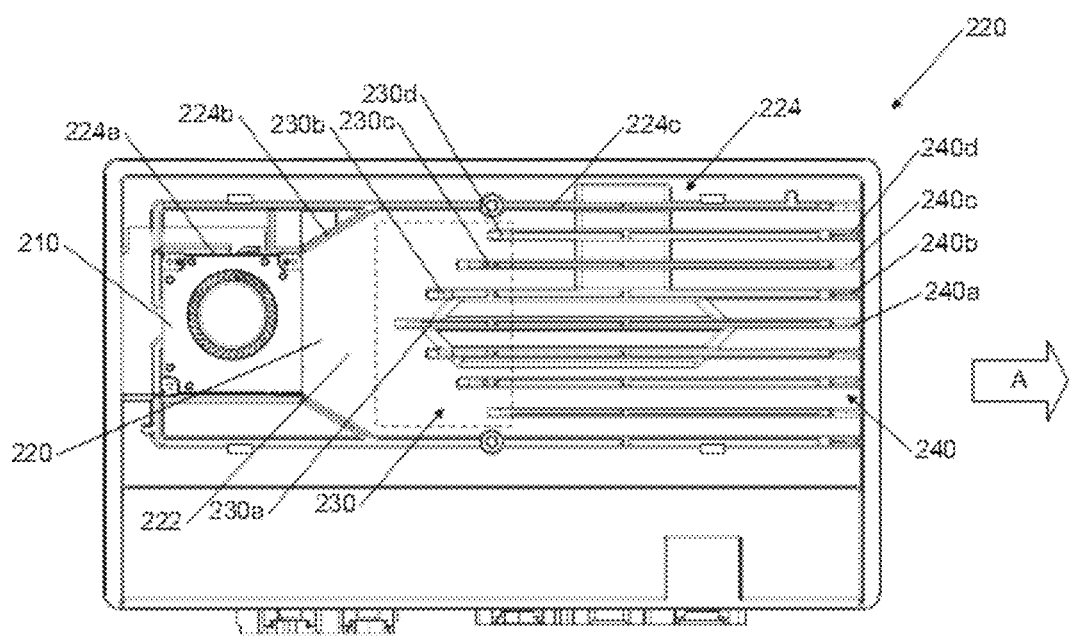
FIG. 7 is a top view of a heat-dissipation device according to another preferred embodiment of this utility model.
Figure 8:
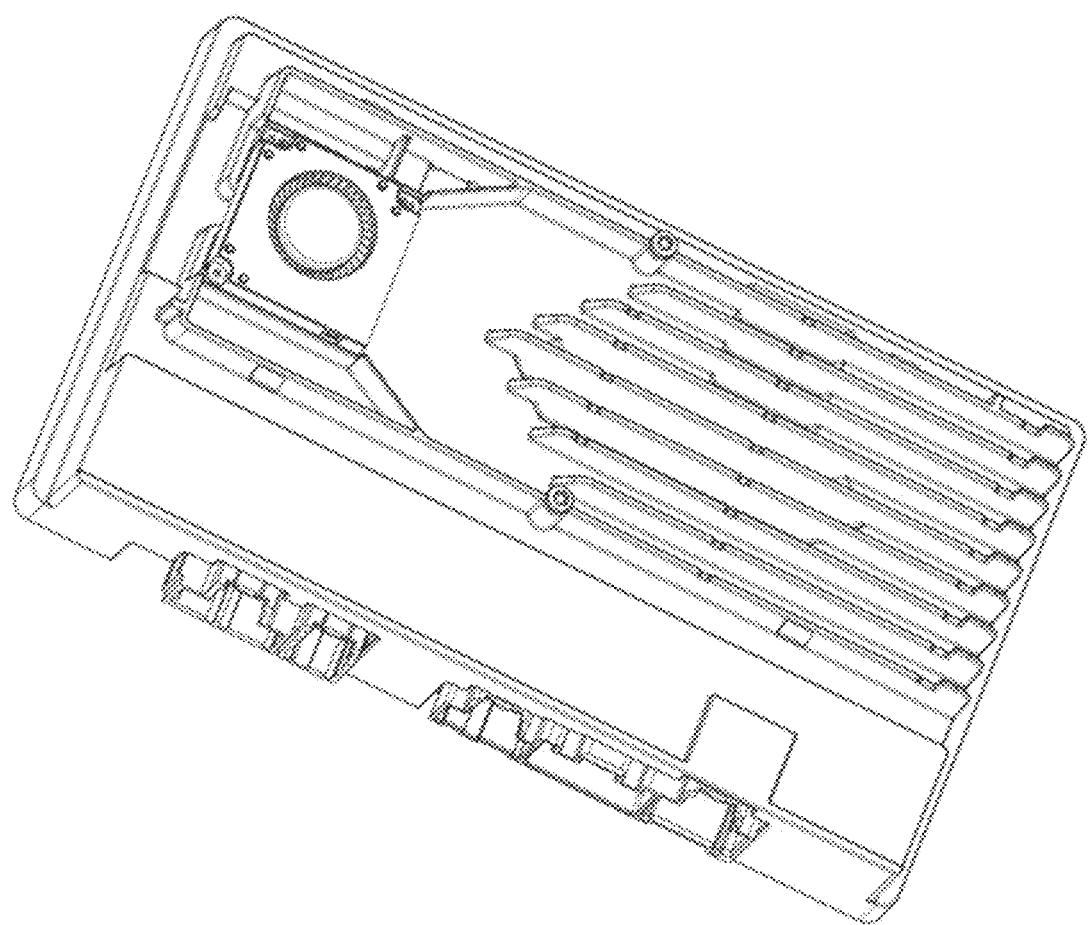
FIG. 8 is a three-dimensional view of the heat-dissipation device shown in FIG. 7.

FIG. 7 to FIG. 8 show another preferred embodiment of this utility model. FIG. 7 is a top view, and FIG. 8 is a three-dimensional view. The embodiment shown in FIG. 7 to FIG. 8 is different from the embodiment shown in FIG. 1 to FIG. 3 mainly in that heat-dissipation flow-guiding devices 230 are integral extension parts of heat-dissipation fins 240.

As shown in FIG. 7, a heat-dissipation device 200 includes an airflow channel 220. The airflow channel 220 is defined by a bottom wall 222, two side walls 224, and a top wall (not shown). A fan 210, a plurality of heat-dissipation flow-guiding devices 230, and a plurality of heat-dissipation fins 240 are arranged in the airflow channel 220. In this embodiment, the heat-dissipation flow-guiding devices 230 are integral extension parts of the heat-dissipation fins. The parts within the dashed frame are the heat-dissipation flow-guiding devices 230, and the parts outside the dashed frame are the heat-dissipation fins 240. An airflow from the fan 210 flows approximately along a longitudinal direction A of the airflow channel 220, and flows through the plurality of heat-dissipation flow-guiding devices 230 and the plurality of heat-dissipation fins 240 in sequence, and takes away the heat of the heat-dissipation flow-guiding devices 230 and the heat-dissipation fins 240, thus achieving heat dissipation.

As shown in the figures, the plurality of heat-dissipation fins 240 include seven heat-dissipation fins arranged in parallel. The seven heat-dissipation fins extend along the longitudinal direction of the airflow channel 220, and are evenly spaced apart from each other and apart from corresponding side walls. The seven heat-dissipation fins are symmetrically distributed horizontally. In order to save space, the four heat-dissipation flow-guiding column rows above are mainly described here. The plurality of heat-dissipation flow-guiding devices 230 are integral extension parts of the plurality of heat-dissipation fins 240. As shown in the figures, the plurality of heat-dissipation flow-guiding devices 230 include seven heat-dissipation flow-guiding fins integrally extending from the seven heat-dissipation fins. The heat-dissipation flow-guiding fin 230a is an integral extension part of the heat-dissipation fin 240a, the heat-dissipation flow-guiding fin 230b is an integral extension part of the heat-dissipation fin 240b, the heat-dissipation flow-guiding fin 230c is an integral extension part of the heat-dissipation fin 240c, and the heat-dissipation flow-guiding fin 230d is an integral extension part of the heat-dissipation fin 240d.

As shown in FIG. 7 and FIG. 8, in a direction from a central position of the airflow channel 220 to two sides, lengths of the heat-dissipation flow-guiding fins are descending and longitudinal distances between them and the fan 210 are ascending. That is, the length of the heat-dissipation flow-guiding fin 230a in the central position of the airflow channel 220 is the longest, followed by the length of the heat-dissipation flow-guiding fin 230b and the length of the heat-dissipation flow-guiding fin 230c, and the length of the heat-dissipation flow-guiding fin 230d is the shortest. The longitudinal distance between the heat-dissipation flow-guiding fin 230d and the fan 210 is the greatest, followed by the longitudinal distance between the heat-dissipation flow-guiding fin 230c and the fan 210 and the longitudinal distance between the heat-dissipation flow-guiding fin 230b and the fan 210, and the longitudinal distance between the heat-dissipation flow-guiding fin 230a and the fan 210 is the shortest.

The inventor of this utility model has found that when the heat-dissipation flow-guiding device of this utility model is absent, the airflow from the fan mainly passes through the central position of the airflow channel, that is, the wind speed at two sides of the heat-dissipation fin 240a is maximum, while the wind speed between the heat-dissipation fin 240d and the side wall is very small.

As described above, the lengths of the heat-dissipation flow-guiding fins are descending in a direction from the central position of the airflow channel 220 to two sides. Therefore, an isosceles triangle shape is formed by front ends of the seven heat-dissipation flow-guiding fins, and the vertex of the triangle faces the fan 210. The configuration of the heat-dissipation flow-guiding fins is conducive to guiding the airflow from the central position of the airflow channel 220 to two sides. As such, the airflow originally concentrated in the central position of the airflow channel 120 is dispersed by the heat-dissipation flow-guiding fins and passes more evenly between the heat-dissipation fins, thus improving the heat dissipation efficiency.

In order to verify the technical effect of this utility model, the inventor of this utility model uses fluid mechanics software to carry out numerical simulation on the embodiment shown in FIG. 7 to FIG. 8 and a comparative embodiment. The comparative embodiment is basically similar to the embodiment shown in FIG. 7 to FIG. 8, with the only difference that the comparative embodiment does not include the inclined side wall 224*b* (that is, the side wall 224*a* is at a right angle with the side wall 224*c*) and the heat-dissipation flow-guiding device 230. That is, the front ends of the heat-dissipation fins are aligned to each other in the comparative embodiment. Please refer to Table 2 for the results of numerical simulation. Position 1 is between heat-dissipation fins 240*a* and 240*b*, Position 2 is between heat-dissipation fins 240*b* and 240*c*, Position 3 is between heat-dissipation fins 240*c* and 240*d*, and Position 4 is between the heat-dissipation fin 240*d* and the side wall.

TABLE 2

| | Position 1 | Position 2 | Position 3 | Position 4 | Average |
|---|---|---|---|---|---|
| Comparative embodiment | 2.18 m/s | 1.72 m/s | 0.039 m/s | 0.177 m/s | 1.03 m/s |
| Embodiment 2 | 2.35 m/s | 1.79 m/s | 1.16 m/s | 0.67 m/s | 1.49 m/s |

As shown in Table 2, the airflow velocities in the embodiment of FIG. 7 to FIG. 8 are descending from Position 1 to Position 4, but the rate of decline is much lower than the rate of decline in the comparative embodiment. As shown in the figures, the airflow velocity in Position 4 of FIG. 7 to FIG. 8 is ¼ greater than the airflow velocity in Position 1, while the airflow velocity in Position 4 is less than 1/10 of the airflow velocity in Position 1 in the comparative embodiment. Therefore, compared with the comparative embodiment, the airflow in the entire airflow channel 120 in the embodiment of FIG. 7 to FIG. 8 is more even.

In addition, the average velocity in Positions 1-4 in the embodiment of FIG. 7 to FIG. 8 is 1.49 m/s, while the average velocity in Positions 1-4 in the comparative embodiment is 1.03 m/s. Therefore, the average airflow velocity in the entire airflow channel in Embodiment 1 is greater, and the heat dissipation effect is also better.

In the embodiment of FIG. 7 to FIG. 8, the heat-dissipation flow-guiding devices 230 are integral extension parts of the heat-dissipation fins 240, but this utility model is not limited thereto. In an optional embodiment, the heat-dissipation flow-guiding devices 230 and the heat-dissipation fins 240 may be individual parts separated from each other.

In the embodiments shown in FIG. 1 to FIG. 3 and FIG. 7 to FIG. 8, the fan is used as the airflow source in this utility model, but this utility model is not limited thereto. In an optional embodiment, any suitable airflow source can be used in this utility model as long as it does not depart from the essence and scope of this utility model.

As described above, the heat-dissipation flow-guiding devices 130 and 230 of this utility model can make the airflow from the fan reach the heat-dissipation fins 140 and 240 more evenly, thus improving the heat dissipation efficiency. At the same time, as the heat-dissipation flow-guiding devices 130 and 230 are also heat-dissipation devices, for example, the heat-dissipation flow-guiding device 130 is an array of heat-dissipation flow-guiding columns, and the heat-dissipation flow-guiding device 230 is an integral extension part of the heat-dissipation fin 240, the heat-dissipation flow-guiding device in this utility model can further improve the heat dissipation efficiency. In addition, a plurality of heat-dissipation flow-guiding column rows of the heat-dissipation flow-guiding device 130 are spaced apart from each other transversely, and the heat-dissipation fins of the heat-dissipation flow-guiding device 230 are also spaced apart from each other transversely; therefore, the heat-dissipation flow-guiding device in this utility model basically may not increase wind resistance.

The exemplary embodiments described above are only used to illustrate the principles of this utility model and are not intended to limit the protection scope of this utility model. Those of ordinary skill in the art can make various variations and improvements without departing from the spirit and essence of this utility model. These variations and improvements also fall within the protection scope of this utility model.

The invention claimed is:

1. A heat-dissipation device for an electronic device, comprising:
   an airflow channel having a longitudinal direction;
   an airflow source located in the airflow channel;
   a plurality of elongated heat-dissipation fins arranged in the airflow channel;
   a first row of heat-dissipation flow-guiding devices comprising a first plurality of heat-dissipation flow-guiding devices, the first plurality of heat-dissipation flow-guiding devices being arranged in the longitudinal direction in a central position in the airflow channel and located between the airflow source and the plurality of elongated heat-dissipation fins; and
   a second row of heat-dissipation flow-guiding devices comprising a second plurality of heat-dissipation flow-guiding devices, the second plurality of heat-dissipation flow-guiding devices being arranged in the longitudinal direction of the airflow channel between the first row and a side wall of the airflow channel and between the airflow source and the plurality of elongated heat-dissipation fins,
   wherein:
   a first heat-dissipation flow-guiding device of the first plurality of heat-dissipation flow-guiding devices that is located closest to the airflow source is located a first longitudinal distance in the longitudinal direction from the airflow source,
   a second heat-dissipation flow-guiding device of the second plurality heat-dissipation flow-guiding devices that is located closest to the airflow source is located a second longitudinal distance in the longitudinal direction from the airflow source,
   the first longitudinal distance is shorter than the second longitudinal distance; and
   a first length of the first heat-dissipation flow-guiding device in the longitudinal direction and a second length of the second heat-dissipation flow-guiding device in the longitudinal direction are a same length.

2. The heat-dissipation device of claim 1, wherein the plurality of elongated heat-dissipation fins extend along the longitudinal direction of the airflow channel respectively and are spaced apart from each other in a transverse direction perpendicular to the longitudinal direction of the airflow channel.

3. The heat-dissipation device of claim 1, further comprising a third row of heat-dissipation flow-guiding devices comprising a third plurality of heat-dissipation flow-guiding devices between the first row and the second row, and a third longitudinal distance in the longitudinal direction between a third heat-dissipation flow-guiding device of the third plurality of heat-dissipation flow-guiding devices that is located closest to the airflow source and the airflow source is greater than the first longitudinal distance between the first heat-dissipation flow-guiding device and the airflow source and less than the second longitudinal distance between the second heat-dissipation flow-guiding device and the airflow source.

4. The heat-dissipation device of claim 3, wherein a number of the third plurality of heat-dissipation flow-guiding devices in the third row is less than a number of the first plurality of heat-dissipation flow-guiding devices in the first row and greater than a number of the second plurality of heat-dissipation flow-guiding devices in the second row.

5. The heat-dissipation device of claim 4, wherein in a transverse direction perpendicular to the longitudinal direction from the central position in the airflow channel to the side wall of the airflow channel, a number of a respective plurality of heat-dissipation flow-guiding devices in each of the first, second, and third rows of heat-dissipation flow-guiding devices is descending.

6. The heat-dissipation device of claim 4, wherein a cross-section shape of each heat-dissipation flow-guiding device of the first, second, and third pluralities of heat-dissipation flow-guiding devices is selected from a rectangle, a circle, an oval, a diamond, or a triangle.

7. The heat-dissipation device of claim 3, wherein the plurality of elongated heat-dissipation fins are parallel to each other.

8. The heat-dissipation device of claim 7, wherein the second row of heat-dissipation flow-guiding devices is located in a transverse direction perpendicular to the longitudinal direction between corresponding two adjacent ones of the elongated heat-dissipation fins or between a corresponding outermost one of elongated heat-dissipation fins and the side wall.

9. The heat-dissipation device of claim 8, wherein at least some of the heat-dissipation flow-guiding devices in the first, second, and third pluralities of heat-dissipation flow-guiding devices are aligned to corresponding heat-dissipation flow-guiding devices in another row of the first and second, rows of heat-dissipation flow-guiding devices.

10. The heat-dissipation device of claim 7, wherein each row of the first, second, and third rows of heat-dissipation flow-guiding devices is centrally located between corresponding two adjacent ones of the elongated heat-dissipation fins or centrally located between an outermost one of the elongated heat-dissipation fins and the side wall.

11. The heat-dissipation device of claim 1, wherein:
the plurality of elongated heat-dissipation fins are parallel to each other; and
the second row of heat-dissipation flow-guiding devices is located in a transverse direction perpendicular to the longitudinal direction between corresponding two adjacent ones of the elongated heat-dissipation fins or between a corresponding outermost one of elongated heat-dissipation fins and the side wall.

12. The heat-dissipation device of claim 1, wherein:
the plurality of elongated heat-dissipation fins are parallel to each other; and
each row of the first and second rows of heat-dissipation flow-guiding devices is centrally located between corresponding two adjacent ones of the elongated heat-dissipation fins or centrally located between an outermost one of the elongated heat-dissipation fins and the side wall.

13. The heat-dissipation device of claim 12, wherein at least some of the heat-dissipation flow-guiding devices in the first and second pluralities of heat-dissipation flow-guiding devices are aligned to corresponding heat-dissipation flow-guiding devices in another row of the first and second rows of heat-dissipation flow-guiding devices.

14. The heat-dissipation device of claim 1, wherein the first plurality of heat-dissipation flow-guiding devices are made of aluminum or steel.

15. The heat-dissipation device of claim 1, wherein the airflow source is a fan.

16. The heat-dissipation device of claim 1, wherein the side wall comprises an inclined sidewall portion extending outward in an airflow direction of the airflow channel and located downstream of the airflow source.

17. An electronic device, comprising:
a heat-dissipation device, comprising:
an airflow channel having a longitudinal direction;
an airflow source located in the airflow channel;
a plurality of elongated heat-dissipation fins arranged in the airflow channel;
a first row of heat-dissipation flow-guiding devices comprising a first plurality of heat-dissipation flow-guiding devices, the first plurality of heat-dissipation flow-guiding devices being arranged in the longitudinal direction in a central position in the airflow channel and located between the airflow source and the plurality of elongated heat-dissipation fins; and
a second row of heat-dissipation flow-guiding devices comprising a second plurality of heat-dissipation flow-guiding devices, the second plurality of heat-dissipation flow-guiding devices being arranged in the longitudinal direction between the first row and a wall of the airflow channel and between the airflow source and the plurality of elongated heat-dissipation fins,
wherein:
a first heat-dissipation flow-guiding device of the first plurality of heat-dissipation flow-guiding devices that is located closest to the airflow source is located a first longitudinal distance in the longitudinal direction from the airflow source,
a second heat-dissipation flow-guiding device of the second plurality of heat-dissipation flow-guiding devices that is located closest to the airflow source is located a second longitudinal distance in the longitudinal direction from the airflow source,
the first longitudinal distance is shorter than the second longitudinal distance; and
a first length of the first heat-dissipation flow-guiding device in the longitudinal direction and a second length of the second heat-dissipation flow-guiding device in the longitudinal direction are a same length.

18. The electronic device of claim 17, wherein the heat-dissipation device comprises a third row of heat-dissipation flow-guiding devices comprising a third plurality of heat-dissipation flow-guiding devices between the first row and the second row, and a third longitudinal distance in the longitudinal direction between a third heat-dissipation flow-guiding device of the third plurality of heat-dissipation flow-guiding devices that is located closest to the airflow source and the airflow source is greater than the first longitudinal distance between the first heat-dissipation flow-guiding device and the airflow source and less than the second longitudinal distance between the second heat-dissipation flow-guiding device and the airflow source.

19. The electronic device of claim 18, wherein a number of the third plurality of heat-dissipation flow-guiding devices in the third row is less than a number of the first plurality of heat-dissipation flow-guiding devices in the first row and greater than a number of the second plurality of heat-dissipation flow-guiding devices in the second row.

20. The electronic device of claim 17, wherein:
the plurality of elongated heat-dissipation fins are parallel to each other; and
the second row of heat-dissipation flow-guiding devices is located in a transverse direction perpendicular to the longitudinal direction between corresponding two adjacent ones of the elongated heat-dissipation fins or between a corresponding outermost one of elongated heat-dissipation fins and the wall.

* * * * *